(12) United States Patent
Kim et al.

(10) Patent No.: US 9,887,163 B2
(45) Date of Patent: Feb. 6, 2018

(54) SEMICONDUCTOR PACKAGE AND METHOD OF MANUFACTURING THE SAME

(71) Applicant: Hana Micron Inc., Asan-si (KR)

(72) Inventors: Hyun Joo Kim, Cheonan-si (KR); Seung Hwan Lee, Cheonan-si (KR)

(73) Assignee: Hana Micron Inc., Asan-si (KR)

( * ) Notice: Subject to any disclaimer, the term of this patent is extended or adjusted under 35 U.S.C. 154(b) by 0 days.

(21) Appl. No.: 15/088,206

(22) Filed: Apr. 1, 2016

(65) Prior Publication Data
US 2017/0141045 A1    May 18, 2017

(30) Foreign Application Priority Data
Nov. 17, 2015 (KR) .......................... 10-2015-0161106

(51) Int. Cl.
| | |
|---|---|
| *H01L 23/552* | (2006.01) |
| *H01L 23/31* | (2006.01) |
| *H01L 23/498* | (2006.01) |
| *H01L 21/48* | (2006.01) |
| *H01L 21/56* | (2006.01) |
| *H01L 23/00* | (2006.01) |
| H01L 21/60 | (2006.01) |

(52) U.S. Cl.
CPC .......... *H01L 23/552* (2013.01); *H01L 21/485* (2013.01); *H01L 21/4853* (2013.01); *H01L 21/565* (2013.01); *H01L 23/3114* (2013.01); *H01L 23/49811* (2013.01); *H01L 23/49838* (2013.01); *H01L 24/97* (2013.01); *H01L 2021/60022* (2013.01); *H01L 2224/16225* (2013.01); *H01L 2224/32145* (2013.01); *H01L 2224/48091* (2013.01); *H01L 2224/48227* (2013.01); *H01L 2224/73253* (2013.01); *H01L 2224/73265* (2013.01); *H01L 2224/97* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC .......................... H01L 23/552; H01L 23/3114
See application file for complete search history.

(56) References Cited

U.S. PATENT DOCUMENTS

| | | |
|---|---|---|
| 2012/0062439 A1 | 3/2012 | Liao et al. |
| 2014/0103527 A1 | 4/2014 | Marimuthu et al. |

FOREIGN PATENT DOCUMENTS

| | | |
|---|---|---|
| KR | 1020010111017 A | 12/2001 |
| KR | 1020150017179 A | 2/2015 |
| KR | 1020150094155 A | 8/2015 |

*Primary Examiner* — Amar Movva
(74) *Attorney, Agent, or Firm* — The Webb Law Firm

(57) ABSTRACT

The present invention relates to a semiconductor package and a method of manufacturing the same. Specifically, the present invention relates to a semiconductor package including a substrate; a semiconductor chip mounted on the substrate; a connection element including an insulator mounted on the substrate and a first connection part of a conductive material formed at an end of the insulator; a molding part surrounding the semiconductor chip, and sealing the connection element for an upper surface of the first connection part to be exposed; and a shield layer surrounding the molding part, and forming an opening part on a part corresponding to the first connection part.

6 Claims, 6 Drawing Sheets

[FIG 1]
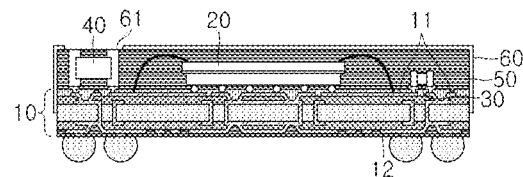
[FIG 2]
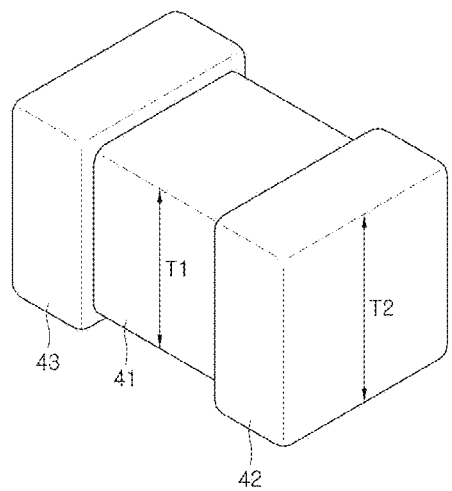
[FIG 3A]
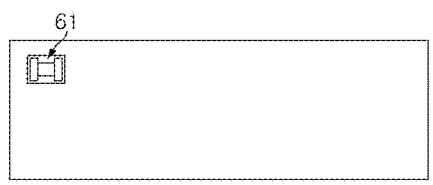
[FIG 3B]
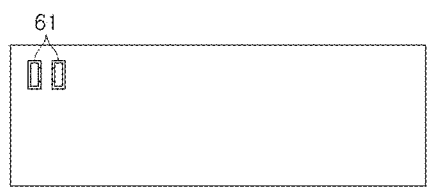

[FIG 3C]
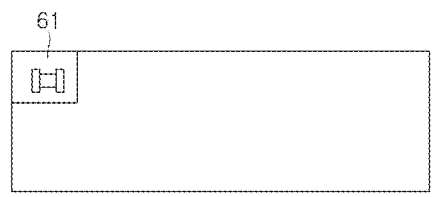
[FIG 4]
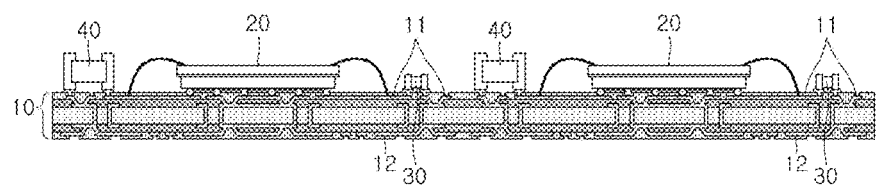

[FIG 5]
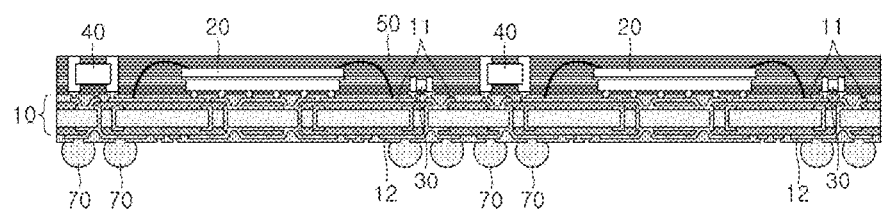

[FIG 6]
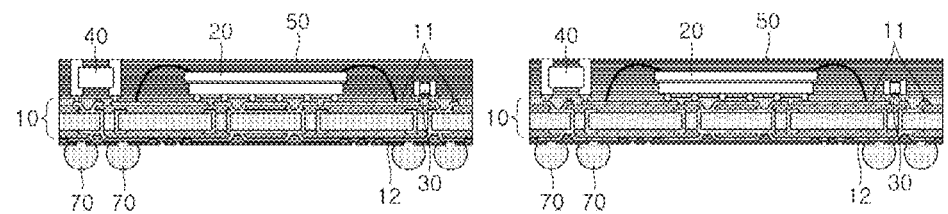

[FIG 7]
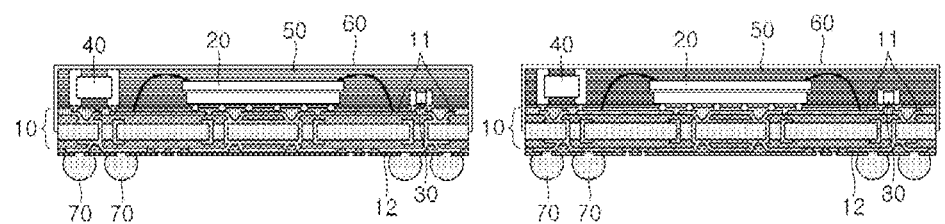

[FIG 8]
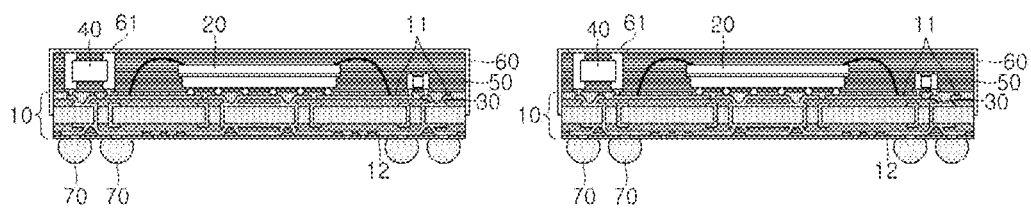

SEMICONDUCTOR PACKAGE AND METHOD OF MANUFACTURING THE SAME

CROSS-REFERENCE TO RELATED APPLICATION

This application claims priority to Korean Patent Application No. 10-2015-0161106 filed Nov. 17, 2015, the disclosure of which is hereby incorporated in its entirety by reference.

TECHNICAL FIELD

The present invention relates to a semiconductor package and a method of manufacturing the same, and particularly to a semiconductor package configured to provide an electric connection with an outside of a shield layer using a connection element including a connection part formed at an end surface of an insulator to a substrate mounted with a semiconductor chip, and a method of manufacturing the same.

BACKGROUND ART

Electronic devices may have at least two electronic accessories electrically connected to each other. For example, a plurality of semiconductor chips may be mounted on a substrate, and the substrate may be electrically connected to another substrate.

In this case, when the semiconductor chip mounted on the substrate is a communication chip, the substrate and an antenna should be electrically connected. Strictly speaking, the communication chip and antenna should be electrically connected.

The above-mentioned electronic devices provide diversified functions, while devices that can be easily carried would be more competitive. For example, when portable electronic devices have the same function, a device which is slimmer and smaller would be preferred.

Thus, portable electronic device manufacturers make efforts to develop a device which is slimmer and smaller compared to other products, while having the same or more remarkable functions.

As part of this trend, accessories included in the electronic device may be arranged, while being spaced apart from each other at a predetermined interval. This spaced-apart arrangement may result from the design structure among each accessory of the electronic device, or from preventing performance degradation of counterpart accessories by noise generated in each accessory.

For example, in order to shield noise or electromagnetic waves emitted from the semiconductor chips mounted on the substrate, a shield layer may be formed on an upper part of the semiconductor chips. Additionally, in order to effectively ground electrostatic discharge generated from an outside, an electric connection may be made between the substrate and the semiconductor chip mounted on the substrate.

To electrically connect the at least two accessories mentioned above, an additional electric connection device is necessary. Additionally, these electric connection devices need to be configured so that the electronic device can be used for a long time, has remarkable durability against an external impact, and has a reliable electric connection structure.

Also, the electric connection device needs to be competitive compared to other products, by reducing manufacturing costs thereof.

Furthermore, as mentioned above, the electric connection device needs to be slim and small to comply with the requirements for manufacturing electronic devices.

That is, the electric connection device needs to be slim and small, provide a reliable electric connection structure, and be competitive in manufacturing costs.

PRIOR ARTS

Patent Documents

Korean Patent Laid-Open No. 2015-0017179
Korean Patent Laid-Open No. 2015-0094155
Korean Patent Laid-Open No. 2001-0111017

SUMMARY OF INVENTION

In order to achieve the above-mentioned purpose, the present invention aims to provide a semiconductor package configured to provide electric connection with an outside of a shield layer using a connection element including a connection part formed at an end surface of an insulator to a substrate mounted with a semiconductor chip, and a method of manufacturing the same.

One aspect of the present invention includes a substrate; a semiconductor chip mounted on the substrate; a connection element including an insulator mounted on the substrate and a first connection part of a conductive material formed at an end of the insulator; a molding part surrounding the semiconductor chip, and sealing to surround the connection element for an upper surface of the first connection part to be exposed; and a shield layer surrounding the molding part, and forming an opening part on a part corresponding to the first connection part.

Additionally, the connection element in one aspect of the present invention includes a second connection part of a conductive material formed on another end of the insulator.

Also, the insulator in one aspect of the present invention is a rectangular parallelepiped, the first connection part covers an entire surface of one end of the insulator, and a part thereof is formed to be rotatably inserted into each side surface of the insulator, and the second connection part covers an entire surface of another end of the insulator, and a part thereof is formed to be rotatably inserted into each side surface of the insulator.

The opening part in one aspect of the present invention is formed for the first connection part and the second connection part to be exposed.

The opening part in one aspect of the present invention is formed for the first connection part, the second connection part, and a part of an upper surface of the insulator to be exposed.

A thickness T1 of the insulator in one aspect of the present invention is smaller than a thickness T2 of the first connection part.

The semiconductor chip in one aspect of the present invention is a communication chip, and the communication chip is electrically connected to an external antenna of a shield layer through a connection element.

An insulating part of the connection element in one aspect of the present invention is formed of ceramic, and the first and second connection parts are formed of solder (tin) or copper.

Meanwhile, another aspect of the present invention includes the steps of (A) mounting on a substrate an insulator, a connection element including a first connection part of a conductive material formed at one end of the insulator, and a semiconductor chip; (B) forming a molding part with a thickness corresponding to a thickness of the first connection part of the connection element; and (C) forming a shield layer surrounding the molding part and forming an opening part for the first connection part to be exposed.

Additionally, the step (B) in another aspect of the present invention is characterized by forming a molding part to surround the semiconductor chip, and seal the connection element for an upper surface of the first connection part to be exposed.

Also, the step (B) forms the molding part sealed to cover the semiconductor chip and the upper surface of the first connection part. The step (C) removes the molding part at the top of the first connection part when forming the opening part in the shield layer for the first connection part to be exposed.

Furthermore, the connection element in another aspect of the present invention includes a second connection part formed at another end of the insulator, and the step (C) forms the shield layer forming the opening part for the second connection part to be exposed.

Also, the step (C) in another aspect of the present invention includes the steps of (C-1) forming the shield layer to surround the molding part; and (C-2) forming the opening part in the shield layer for the first connection part to be exposed.

According to the present invention as above, since the present invention includes a connection part as a connection element at an end of an insulator and uses a structure similar to a capacitor shape, the present invention may use a mounting device used for mounting a capacitor chip, thereby reducing costs, etc. required for manufacturing a new device.

That is, unlike the present invention, when a post, etc. is used for an electric connection, a new mounting device is necessary, and more costs would incur for designing and manufacturing this new mounting device. Unlike this, when a capacitor shape is used, capacitor mounting devices which have already been developed could be used immediately, thereby reducing the costs.

Additionally, according to the present invention, the capacitor shape is used as the connection element, so a conventional method of manufacturing a capacitor could be used, thereby preventing an increase in costs for technology development.

Also, according to the present invention, the connection part providing electric connection is exposed to an outside of the insulator, thereby remarkably reducing a possibility for electric defects to occur.

That is, unlike the present invention, when processing a hole in a molding with a laser and filling the hole using a plating, etc. to provide electric connection, a void, etc. may occur in a plating layer filled inside the hole, thereby decreasing the reliability of electric connection. However, since the connection part of the present invention is exposed to the outside of the insulator, electrical reliability may be secured.

Furthermore, unlike the present invention, when processing the hole in the molding with the laser for electric connection, a lot of costs would incur for the hole processing. However, the present invention does not use the laser, so the costs may be reduced.

BRIEF DESCRIPTION OF THE DRAWINGS

FIG. 1 is a cross-sectional view illustrating a semiconductor package according to one embodiment of the present invention;

FIG. 2 is a perspective view illustrating a connection element used in FIG. 1;

FIGS. 3A, 3B, and 3C are top plan views illustrating a shield layer of FIG. 1; and FIGS. 4, 5, 6, 7, and 8 are cross-sectional views illustrating a method of manufacturing a semiconductor package according to one embodiment of the present invention.

BEST MODE FOR CARRYING OUT THE INVENTION

The present invention may have various modifications and embodiments. Thus, hereinafter, specific embodiments of the present invention will be explained in detail with reference to the drawings attached.

In case of explaining the present invention, when it is determined that specific explanation on related prior arts clouds the summary of the present invention, the detailed description thereof is omitted.

The terms such as a first, a second, etc. may be used for explaining various constitutional elements, but the constitutional elements are not limited by those terms, and the terms are used only for distinguishing one constitutional element from another constitutional element.

FIG. 1 is a cross-sectional view illustrating a semiconductor package according to one embodiment of the present invention.

Referring to FIG. 1, the semiconductor package according to one embodiment of the present invention includes a substrate 10, a semiconductor chip 20 mounted on the substrate 10, an electronic part 30 arranged around the semiconductor chip 20, a connection element 40 mounted on the substrate 10 and electrically connecting the semiconductor chip 20 with an electronic device of an outside of a shield layer 60, and a molding part 50 surrounding the semiconductor chip 10, and a shield layer 60.

As the substrate 10, various types of substrates which are known in the related technical field may be used. For example, a ceramic substrate, a printed circuit board, a flexible substrate, etc. may be used.

In this case, the substrate 10 according to the present invention may be a multi-layered substrate formed with a plurality of layers. In each layer, a circuit wiring for electric connection may be formed, and a via which electrically connects the circuit wiring formed in each layer may be formed.

Additionally, a first connection pad 11 for mounting the semiconductor 20, electronic part 30 and connection element 40 is formed in an upper surface of the substrate 10, and a second connection pad 12 for being electrically connected with an external substrate (not illustrated) such as a main substrate on which the semiconductor package is mounted may be formed on a lower surface of the substrate 10. Additionally, although it is not illustrated, the circuit wiring may be formed for electric connection between the first connection pad 11 and the second connection pad 12.

Meanwhile, at least one semiconductor chip 20 is mounted on the upper surface of the substrate 10.

In this case, the semiconductor chip 20 may be mounted on the first connection pad 11, and the semiconductor chip 20 may be mounted on the first connection pad 11 by a wire bonding manner or a flip chip bonding manner.

The semiconductor chip 20 may be a communication chip, and the semiconductor chip 20 may support communication function of WiFi, GPS, Bluetooth, etc.

This semiconductor chip 20 includes the electronic part 30 consisting of a passive element such as a capacitor, an inductor, resistance, etc. or an active element such as a diode, a transistor, etc. to perform a desired operation.

Next, the connection element 40 is formed on the upper surface of the substrate 10 to provide electric connection between the substrate 10 and an external electronic device of the shield layer 60. Here, the external electronic device may be an antenna.

In this case, the connection element 40 may be mounted on the first connection pad 11, and the connection element 40 may be mounted on the first connection pad 11 by the flip chip bonding manner.

The connection element 40 is formed of a capacitor shape, and includes an insulator 41, a first connection part 42, and a second connection part 43 as illustrated in the perspective view of FIG. 2. Here, the connection element 40 is configured to include the first connection part 42 and the second connection part 43, but it may also include either one of the first connection part 42 or the second connection part 43.

There is no particular limitation on the shape of the insulator 41, but preferably it may have a rectangular parallelepiped shape. Additionally, there is no particular limitation on the size, and the size may be properly adjusted according to the use. For example, the size may be (0.6 to 5.6 mm)×(0.3 to 5.0 mm)×(0.3 to 1.9 mm).

The insulator 41 has a pair of ends facing each other in the longitudinal direction of the insulator 41, a pair of side surfaces facing each other in the laminating direction of the insulator 41, and a pair of side surfaces facing each other in the longitudinal, laminating and vertical directions.

The first connection part 42 covers an entire surface of one end, and a part thereof is formed to be rotatably inserted into each side surface. Additionally, the second connection part 43 covers an entire surface of another end, and a part thereof is formed to be rotatably inserted into each side surface.

Any one side surface of the pair of side surfaces facing each other in the laminating direction of the insulator 41 is a surface facing the substrate 10 when the connection element 40 is mounted on the substrate 10.

These first and second connection parts 42 and 43 are formed of conductive materials. There is no particular limitation on the material, but Ni, Cu, or an alloy thereof may be used.

A thickness of the first and second connection parts 42 and 43 may be properly determined according to the use, etc. For example, the thickness may be about 10 to 100 μm.

Here, the thickness T1 of the insulator 41 is smaller than the thickness T2 of the first and second connection parts 42 and 43.

Next, the molding part 50 is formed in one surface of the substrate 10 to cover an entire surface.

Here, the molding part 50 is formed to cover the semiconductor chip 20 mounted on the substrate 10 and electronic part 30, thereby preventing an electric short from occurring between the semiconductor chip 20 and electronic part 30. Additionally, the semiconductor chip 20 and the electronic part 30 are fixed on the substrate 10 to stably protect the semiconductor chip 20 and the electronic part 30 from an external impact, thereby securing high reliability.

Additionally, the molding part 50 is formed to surround the connection element 40 mounted on the substrate 10, and it is formed for upper surfaces of the first connection part 42 and the second connection part 43 of the connection element 40 to be exposed.

Of course, the molding part 50 may be formed for the entire upper surfaces of the first connection part 42 and the second connection part 43 to be exposed. Furthermore, the molding part 50 may be formed for a part or a whole of the upper surface exposed to the outside of the insulator to be exposed.

The molding part 50 may be formed of an insulating material including a resin material such as epoxy, etc. Additionally, the molding part 50 according to the embodiment of the present invention may be formed by laying the substrate 10 on which the semiconductor chip 30, etc. is mounted in a mold, and injecting a molding resin inside the mold, but is not limited thereto.

Next, the shield layer 60 may be formed to surround the molding part 50. The shield layer 60 may be formed of a conductive material.

For example, the shield layer 60 may be formed by coating a resin material including conductive powder on an outer surface of the molding part 50.

The shield layer 60 may be formed by attaching a metal thin film to the outer surface of the molding part 50. Here, the metal thin film may be formed by various methods such as sputtering, vapor deposition, spray coating, screen printing, electrodeposition, electroless plating, etc. The shield layer 60 may be formed independently without an additional connection with another component, or may be electrically connected with a ground layer (not illustrated) of the substrate 10.

With regard to the shield layer 60, the opening part 61 is formed on a part corresponding to the upper part of the first connection part 42 and the second connection part 43 of the connection element 40, allowing electric connection with an external electronic device using various connection means.

The opening part 61 may consist of one opening part 61 as illustrated in FIG. 3A, and may consist of two opening parts corresponding to the first connection part 42 and the second connection part 43, respectively, as illustrated in FIG. 3B.

Additionally, upon viewing the connection element 40 from the top, the opening part 61 may have a size the same or bigger than a plane.

In this case, as illustrated in FIG. 3C, the opening part 61 may be formed in a part of an edge of the shield layer 60.

The semiconductor package configured as above may electrically connect the semiconductor chip 20 with the external electronic device of the shield layer 60 using the connection element 40.

FIGS. 4 to 8 are cross-sectional views illustrating a method of manufacturing a semiconductor package according to one embodiment of the present invention.

As illustrated in FIG. 4, first, the semiconductor chip 20, the electronic part 30 and the connection element 40 are mounted on the first connection pad 11 formed on the upper surface of the substrate 10.

In this case, the semiconductor chip 20 may be mounted on the first connection pad 11 using the wire bonding manner or flip chip bonding manner. Also, the electronic part 30 and the connection part 40 may be mounted using the flip chip bonding manner, etc.

Next, as illustrated in FIG. 5, the molding part 50 is formed with a thickness corresponding to the thickness of the first connection part 42 and second connection part 43 of the connection element 40.

In this case, since the thickness of the semiconductor chip 20 mounted on the upper surface of the substrate 10, and the electronic part 30 is smaller than the thickness of the first connection part 42 and the second connection part 43 of the connection element 40, they are formed to be covered by the molding part 50.

However, the upper surface of the first connection part 42 and the second connection part 43 of the connection element 40 may be formed for a part or a whole thereof to be exposed.

Additionally, the upper surface of the insulator 41 of the connection element 40 may be formed for a part or a whole thereof to be exposed.

Unlike the above, the molding part 50 may be formed to cover the first connection part 42 and the second connection part 43 of the connection element 40.

In this case, by allowing the molding part to cover the first connection part and the second connection part with a very thin thickness, the first connection part 42 and the second connection part 43 could be exposed when forming the opening part in the shield layer 60 afterwards.

The molding part 50 may be formed by laying the substrate 10 on which the semiconductor 20, the electronic part 30 and the connection part 40 are mounted in the metal mold, and injecting the molding resin inside the metal mold.

After the molding process is completed, a process of attaching a solder ball 70 to a lower part of the substrate 10 may be further proceeded.

Next, as illustrated in FIG. 6, cutting proceeds using a saw blade made of a diamond material.

Additionally, referring to FIG. 7, the shield layer 60 is formed by using a conductive material on the surface of the molding part 50 in an output processed with the cutting.

The shield layer 60 may be used when it is a conductive material. As an example of the conductive material, metals such as copper and aluminum or metallic compounds of copper and aluminum may be used. In general, since the metals include free electron with mobility therein, they operate very effectively by the reflection of electromagnetic waves. However, since the metals are heavy, they may be used by being coated on a bulk material, fiber, particle, etc. As a method of forming the shield layer 60, methods such as a coating, electroless plating, vacuum deposition, etc. may be used.

When forming the shield layer 60 using a coating or vacuum deposition manner, the shield layer 60 may be formed without an additional protective film. However, when forming the shield layer 60 on a surface of the molding part 60 through the electroless plating, in order to prevent a shorting from occurring in a lower wiring of the substrate and solder ball 70, it is preferable to proceed with the electroless plating, while covering the shield layer 60 using an additional protective film.

Thereafter, as illustrated in FIG. 8, the opening part 61 is formed in the shield layer 60 using a laser drill, etc.

In this case, the opening part may be formed with various shapes as illustrated in FIGS. 3A to 3C.

Additionally, when the first connection part 42 and the second connection part 43 of the connection element 40 are covered by the molding part 50 in case of forming the opening part, a part or a whole thereof may be configured to be exposed. Also, when the upper surface of the insulator 41 is covered by the molding part 50, a whole or a part thereof may be formed to be exposed.

Meanwhile, although the semiconductor package is separated here with one cutting, a unit semiconductor package may be separated from a strip-shaped substrate by going through a first cutting process of cutting only a part of the molding part from an output in which the molding part is molded using the saw blade, and then forming the conductive material to form the shield layer, and forming an opening part, and then going through a second cutting process to completely cut the substrate.

Since the shield layer is formed only on the upper part of the substrate before the second cutting, this method is characterized in that the shield layer is not formed on the side surface or lower surface of the substrate. Thus, even if a conductive pattern such as circuit wiring exists in the side surface of the substrate, no shorting occurs.

According to the present invention as above, since the present invention includes a connection part as a connection element, the present invention may use a mounting device used for mounting a capacitor, thereby reducing costs, etc. required for manufacturing a new device.

That is, unlike the present invention, when a post, etc. is used for an electric connection, a new mounting device is necessary, and more costs would incur for designing and manufacturing this new mounting device. Unlike this, when a capacitor shape is used, capacitor mounting devices which have already been developed could be used immediately, thereby reducing the costs.

Additionally, according to the present invention, the first and second connection parts providing electric connection are exposed to the outside of the insulator, thereby remarkably reducing a possibility for electric defects to occur.

That is, unlike the present invention, when processing a hole in a molding with a laser and filling the hole using a plating, etc. to provide electric connection, a void, etc. may occur in a plating layer filled inside the hole, thereby decreasing the reliability of electric connection. However, since the connection part of the present invention is exposed to the outside of the insulator, electrical reliability may be secured.

Furthermore, unlike the present invention, when processing the hole in the molding part with the laser for electric connection, a lot of costs would incur for the hole processing. However, the present invention does not use the laser, so the costs may be reduced.

What is claimed is:

1. A semiconductor package, comprising: a substrate;
   a semiconductor chip mounted on the substrate;
   a connection element comprising an insulator mounted on the substrate, a first connection part of a conductive material formed at an end of the insulator and a second connection part of a conductive material formed at another end of the insulator;
   a molding part surrounding the semiconductor chip, and sealing the connection element for an upper surface of the first connection part to be exposed; and
   a shield layer surrounding the molding part, and forming an opening part on a part corresponding to the first connection part,
   wherein the insulator is a rectangular parallelepiped, the first connection part covers an entire surface of one end of the insulator, and a part thereof is formed to be rotatably inserted into each side surface of the insulator, and the second connection part covers an entire surface of another end of the insulator, and a part thereof is formed to be rotatably inserted into each side surface of the insulator.

2. The semiconductor package of claim 1, wherein the opening part is formed for the first connection part and the second connection part to be exposed.

3. The semiconductor package of claim 1, wherein the opening is formed for the first connection part, the second connection part, and a part of an upper surface of the insulator to be exposed.

4. The semiconductor package of claim 1, wherein a thickness T1 of the insulator is smaller than a thickness T2 of the first connection part.

5. The semiconductor package of claim 1, wherein the semiconductor chip is a communication chip, and the communication chip is electrically connected with an external antenna of the shield layer through the connection element.

6. The semiconductor package of claim 1, wherein an insulating part of the connection element is formed of ceramic, and the first and second connection parts are formed of solder (tin) or copper.

* * * * *